US012480031B2

(12) United States Patent
Yukutake et al.

(10) Patent No.: US 12,480,031 B2
(45) Date of Patent: Nov. 25, 2025

(54) THERMALLY CONDUCTIVE RESIN COMPOSITION, CURED PRODUCT, HEAT TRANSFER MEMBER AND ELECTRONIC DEVICE

(71) Applicant: Resonac Corporation, Tokyo (JP)

(72) Inventors: Hajime Yukutake, Minato-ku (JP); Hajime Funahashi, Minato-ku (JP); Hikaru Satoh, Minato-ku (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/266,973

(22) PCT Filed: Apr. 28, 2022

(86) PCT No.: PCT/JP2022/019257
§ 371 (c)(1),
(2) Date: Jun. 13, 2023

(87) PCT Pub. No.: WO2023/007894
PCT Pub. Date: Feb. 2, 2023

(65) Prior Publication Data
US 2024/0052225 A1 Feb. 15, 2024

(30) Foreign Application Priority Data
Jul. 29, 2021 (JP) .................. 2021-124539

(51) Int. Cl.
| | | |
|---|---|---|
| *C09K 5/14* | (2006.01) | |
| *C08G 59/24* | (2006.01) | |
| *C08G 59/32* | (2006.01) | |
| *C08G 59/38* | (2006.01) | |
| *C08G 59/62* | (2006.01) | |
| *C08G 59/68* | (2006.01) | |
| *C08K 3/22* | (2006.01) | |
| *C08K 9/02* | (2006.01) | |
| *H05K 7/20* | (2006.01) | |

(52) U.S. Cl.
CPC .............. *C09K 5/14* (2013.01); *C08G 59/245* (2013.01); *C08G 59/3218* (2013.01); *C08G 59/38* (2013.01); *C08G 59/621* (2013.01); *C08G 59/688* (2013.01); *C08K 3/22* (2013.01); *C08K 9/02* (2013.01); *H05K 7/209* (2013.01); *C08K 2003/2227* (2013.01); *C08K 2201/001* (2013.01)

(58) Field of Classification Search
CPC .... C09K 5/14; C08G 59/245; C08G 59/3218; C08G 59/38; C08G 59/621; C08G 59/688
See application file for complete search history.

(56) References Cited

U.S. PATENT DOCUMENTS

| | | | | |
|---|---|---|---|---|
| 11,814,566 B2* | 11/2023 | Stojanovic | ............... | C08J 9/04 |
| 2014/0349089 A1* | 11/2014 | Ueyama | ............... | C08J 5/249 |
| | | | | 252/75 |
| 2016/0137772 A1* | 5/2016 | Maeda | ............... | C08K 9/04 |
| | | | | 252/75 |
| 2017/0081579 A1* | 3/2017 | Fujikawa | ............... | C08K 3/22 |
| 2017/0210951 A1* | 7/2017 | Abe | ............... | C09J 121/00 |
| 2018/0298186 A1* | 10/2018 | Yoshihara | ............... | C08L 67/02 |
| 2018/0327602 A1* | 11/2018 | Takahashi | ............... | C01B 21/072 |
| 2020/0407618 A1* | 12/2020 | Sawamura | ............... | H01L 23/373 |
| 2021/0057304 A1* | 2/2021 | Koyano | ............... | B32B 25/18 |
| 2022/0064400 A1* | 3/2022 | Nakayama | ............... | C08K 3/22 |
| 2022/0372208 A1* | 11/2022 | Kashino | ............... | C08G 59/42 |
| 2023/0107924 A1* | 4/2023 | Nishiyama | ............... | C08K 9/02 |
| | | | | 106/404 |
| 2023/0134132 A1* | 5/2023 | Komaki | ............... | C09K 5/14 |
| | | | | 423/625 |
| 2023/0193103 A1* | 6/2023 | Komaki | ............... | C09K 5/14 |
| | | | | 252/62 |
| 2023/0220219 A1* | 7/2023 | Ma | ............... | H01M 10/613 |
| | | | | 429/120 |
| 2023/0220263 A1* | 7/2023 | Wada | ............... | C09K 5/14 |
| 2023/0227707 A1* | 7/2023 | Yukutake | ............... | H01L 23/3737 |

FOREIGN PATENT DOCUMENTS

| | | |
|---|---|---|
| JP | 5-247181 A | 9/1993 |
| JP | 2011-84657 A | 4/2011 |
| JP | 5907171 B2 | 4/2016 |
| JP | 6276576 B2 | 2/2018 |
| JP | 2019-38969 A | 3/2019 |
| JP | 2019-67955 A | 4/2019 |
| JP | 2019-150997 A | 9/2019 |
| JP | 2020-73625 A | 5/2020 |
| JP | 2020-73626 A | 5/2020 |
| JP | 2021-66838 A | 4/2021 |
| TW | 201945512 A | 12/2019 |
| TW | 202024238 A | 7/2020 |
| TW | 202115170 A | 4/2021 |
| TW | 202118808 A | 5/2021 |
| WO | 2012/039324 A1 | 3/2012 |
| WO | 2018/139632 A1 | 8/2018 |

(Continued)

*Primary Examiner* — Nelson J Nieves
(74) *Attorney, Agent, or Firm* — Sughrue Mion, PLLC

(57) ABSTRACT

A thermally conductive resin composition includes an epoxy resin and a thermally conductive powder. The thermally conductive powder includes aluminum nitride having a silicon-containing oxide coating on a surface thereof and another thermally conductive powder. The content of the epoxy resin is 1% by mass or more and 20% by mass or less based on the total amount of the thermally conductive resin composition. The content of the thermally conductive powder is 80% by mass or more and 99% by mass or less based on the total amount of the thermally conductive resin composition. The content of the aluminum nitride having a silicon-containing oxide coating on a surface thereof is 10% by mass or more and 70% by mass or less based on the total amount of the thermally conductive resin composition. The content of the other thermally conductive powder is 10% by mass or more and 89% by mass or less based on the total amount of the thermally conductive resin composition.

9 Claims, No Drawings

(56) References Cited

FOREIGN PATENT DOCUMENTS

| WO | 2019/124147 A1 | 6/2019 |
|----|----------------|--------|
| WO | 2022/014129 A1 | 1/2022 |

\* cited by examiner

THERMALLY CONDUCTIVE RESIN COMPOSITION, CURED PRODUCT, HEAT TRANSFER MEMBER AND ELECTRONIC DEVICE

CROSS REFERENCE TO RELATED APPLICATIONS

This application is a National Stage of International Application No. PCT/JP2022/019257 filed Apr. 28, 2022, claiming priority based on Japanese Patent Application No. 2021-124539 filed Jul. 29, 2021.

TECHNICAL FIELD

The present invention relates to a thermally conductive resin composition, a cured product, a heat conducting member, and an electronic device.

BACKGROUND ART

In recent years, as electronic devices and parts have become more sophisticated and more compact, the amount of heat generated from heat sources such as electronic devices has increased, and a lot of research is being carried out into methods for efficiently releasing heat. In order to efficiently release heat from the heat source to a heat sink, a heat conducting material interposed therebetween is required to have high thermal conductivity and also to have insulating properties. As such a thermally conductive material, a thermally conductive resin composition including a matrix of a resin or the like and a powder filled therein that imparts thermal conductivity is generally used.

As the heat conducting material, PTL1 discloses a resin composition containing a filler including alumina particles and boron nitride particles, an elastomer having a specific weight average molecular weight, and a curable resin. Further, the working examples of PTL2 disclose a resin composition containing an epoxy resin, boron nitride particles, and alumina particles.

Particularly high thermal conductivity is required in the case of, for example, a heat conducting material for countermeasures against heat generation in a power module or the like, in which a large amount of heat is generated. However, the resin compositions described in PTL1 and PTL2 has a thermal conductivity of only 12 W/m·K or less, and hence there is room for further improvement.

Under these circumstances, PTL3 discloses a thermally conductive sheet for a semiconductor module having an epoxy resin layer made of an epoxy composition. The epoxy composition includes a specific epoxy monomer, a specific phenol-based curing agent, and boron nitride particles or aluminum nitride particles, and the boron nitride particles or the aluminum nitride particles are contained in the form of aggregated particles. Some of the thermally conductive sheets disclosed in PTL3 have a thermal conductivity as high as 14 W/m·K or more.

CITATION LIST

Patent Literature

PTL1: JP5907171B
PTL2: JP2019-150997A
PTL3: JP6276576B

SUMMARY OF INVENTION

Technical Problem

In the case of a heat conducting material for countermeasures against heat in a power module and the like, particularly high thermal conductivity is required, as well as durability such as heat resistance and moisture resistance. However, according to investigation by the present inventors, it has been found that the thermally conductive sheet described in PTL3 has high thermal conductivity but insufficient durability.

The present invention has been made to solve the above-described problem, and it is an object of the present invention to provide a thermally conductive resin composition exhibiting high thermal conductivity and excellent durability, a cured product of the thermally conductive resin composition, a heat conducting member including the cured product, and an electronic device having the heat conducting member and a heat dissipating member.

Solution to Problem

As a result of intensive investigation aimed at solving the above-described problem, the present inventors have found that the above-described problem can be solved by the following invention.

The present invention includes the following [1] to [11].
[1] A thermally conductive resin composition including an epoxy resin and a thermally conductive powder, wherein
  the thermally conductive powder includes aluminum nitride having a silicon-containing oxide coating on a surface thereof and another thermally conductive powder,
  a content of the epoxy resin is 1% by mass or more and 20% by mass or less based on the total amount of the thermally conductive resin composition,
  a content of the thermally conductive powder is 80% by mass or more and 99% by mass or less based on the total amount of the thermally conductive resin composition, a content of the aluminum nitride having a silicon-containing oxide coating on a surface thereof is 10% by mass or more and 70% by mass or less based on the total amount of the thermally conductive resin composition, and a content of the other thermally conductive powder is 10% by mass or more and 89% by mass or less based on the total amount of the thermally conductive resin composition.
[2] The thermally conductive resin composition according to [1], wherein the aluminum nitride having a silicon-containing oxide coating on a surface thereof has a coverage of 70% or more and 100% or less as determined by low energy ion scattering spectroscopy.
[3] The thermally conductive resin composition according to [1] or [2], wherein the epoxy resin includes at least one selected from the group consisting of a triphenylmethane-type epoxy resin and a bisphenol-type epoxy resin.
[4] The thermally conductive resin composition according to any of [1] to [3], wherein the other thermally conductive powder includes a metal oxide.
[5] The thermally conductive resin composition of [4], wherein the metal oxide includes alumina.
[6] The thermally conductive resin composition according to any of [1] to [5], which is for heat dissipation of a power module.
[7] A cured product of the thermally conductive resin composition according to any of [1] to [6].

[8] The cured product according to [7], wherein the cured product has a thermal conductivity of 14 W/m·K or more and has a rate of reduction in the thermal conductivity of less than 10% after 168 hours in a pressure cooker test at 120° C., 2 atm (0.2 MPa), and 100% relative humidity.
[9] A heat conducting member including the cured product according to [7] or [8].
[10] The heat conducting member according to [9], wherein the heat conducting member is for heat dissipation of a power module.
[11] An electronic device including the heat conducting member according to [9] or [10] and a heat dissipating member.

Advantageous Effects of Invention

According to the present invention, there can be provided a thermally conductive resin composition that exhibits high thermal conductivity and excellent durability. Further, there can be provided a cured product of the thermally conductive resin composition that has high thermal conductivity and excellent durability. In addition, there can be provided a heat conducting member including the cured product, and also an electronic device having the heat conducting member and a heat dissipating member.

For the thermally conductive resin composition of the present invention, it is possible to achieve a thermal conductivity of 14 W/m·K or more and furthermore exhibit excellent durability.

DESCRIPTION OF EMBODIMENTS

Hereinafter, the present invention will be described in detail with reference to embodiments.
<Thermally Conductive Resin Composition>
One embodiment of the present invention is a thermally conductive resin composition includes an epoxy resin and a thermally conductive powder.

The thermally conductive powder includes aluminum nitride having a silicon-containing oxide coating on the surface thereof and another thermally conductive powder (that is, a thermally conductive powder other than the aluminum nitride having a silicon-containing oxide coating on the surface thereof).

The content of the epoxy resin is 1% by mass or more and 20% by mass or less based on the total amount of the thermally conductive resin composition.

The content of the thermally conductive powder is 80% by mass or more and 99% by mass or less based on the total amount of the thermally conductive resin composition. The content of the aluminum nitride having a silicon-containing oxide coating on the surface thereof has a 10% by mass or more and 70% by mass or less based on the total amount of the thermally conductive resin composition. The content of the other thermally conductive powder is 10% by mass or more and 89% by mass or less based on the total amount of the thermally conductive resin composition.

The thermally conductive resin composition of the present embodiment exhibits high thermal conductivity and excellent durability, and therefore a cured product of the thermally conductive resin composition has high thermal conductivity and excellent durability.

Each of the components that can be contained in the thermally conductive resin composition of the present embodiment is now described in detail below.

[1. Epoxy Resin]
The epoxy resin has electrical insulation properties, and functions for increasing adhesion to a metal substrate.

The epoxy resin may be any compound having two or more epoxy groups in one molecule, and any epoxy resin can be appropriately selected for use from among known epoxy resins conventionally used as an epoxy resin. Examples of the epoxy resin include a triphenylmethane-type epoxy resin, a bisphenol-type epoxy resin, a glycidyl ether of a polycarboxylic acid, and an epoxy resin obtained by epoxidation of a cyclohexane derivative. One type of the epoxy resin may be used alone, or two or more types may be used in combination. Among the examples mentioned above, in view of heat resistance, ease of handling, and the like, the epoxy resin preferably includes at least one selected from the group consisting of a triphenylmethane-type epoxy resin and a bisphenol-type epoxy resin. Examples of the bisphenol type epoxy resin include a bisphenol A type epoxy resin and a bisphenol F type epoxy resin. In view of the effect of lowering the softening point of the epoxy resin, it is also preferable to use a bisphenol A type epoxy resin and a bisphenol F type epoxy resin in combination.

The content of the epoxy resin is 1% by mass or more and 20% by mass or less, preferably 1% by mass or more and 10% by mass or less, more preferably 1.5% by mass or more and 7.0 mass % or less, and further preferably 2.0 mass % or more and 5.0 mass % or less, based on the total amount of the thermally conductive resin composition of the present embodiment. When the content of the epoxy resin is 1% by mass or more based on the total amount of the thermally conductive resin composition, the thermally conductive powder can be thoroughly mixed with the epoxy resin. When the content of the epoxy resin is 20% by mass or less based on the total amount of the thermally conductive resin composition, a high thermal conductivity can be maintained.

[2. Thermally Conductive Powder]
The thermally conductive powder is a powder that functions for transferring the heat generated from electronic parts and the like outside of the system (for example, to a heat dissipating member). Examples of the thermally conductive powder include metals, metal nitrides, metal oxides, metal carbides, and metal hydroxides. One type of the thermally conductive powder may be used alone, or two or more types may be used in combination. In view of thermal conductivity and insulation, the thermally conductive powder is preferably a metal nitride or a metal oxide, and in particular preferably includes a metal nitride and a metal oxide.

However, in the present embodiment, the thermally conductive powder includes an aluminum nitride having a silicon-containing oxide coating on the surface thereof (hereinafter, referred to as "silicon-containing oxide coated aluminum nitride"; it is one of metal nitrides), in view of thermal conductivity and durability as well as great ease of filling into the epoxy resin. The thermally conductive powder further includes another thermally conductive powder, and as described above, this other thermally conductive powder preferably includes the above-mentioned metal oxide. Examples of the other thermally conductive powder include, as described above, metals, metal nitrides, metal oxides, metal carbides, and metal hydroxides, but it is noted that the other thermally conductive powder is not the above-mentioned silicon-containing oxide coated aluminum nitride.

As described above, in the present embodiment, the thermally conductive powder includes the silicon-containing oxide coated aluminum nitride, but may further include the above-described metal nitride other than the silicon-containing oxide coated aluminum nitride. Examples of the metal nitride include boron nitride, aluminum nitride (excluding the silicon-containing oxide coated aluminum nitride), and silicon nitride.

In one preferable embodiment, the thermally conductive powder may include the silicon-containing oxide coated aluminum nitride and a metal oxide, in view of exhibiting a thermal conductivity of 14 W/m·K or more and achieving a high durability.

First, the silicon-containing oxide coated aluminum nitride will be described in detail, and the metal oxide will be described later.

(2-1. Aluminum Nitride Having a Silicon-Containing Oxide Coating on the Surface Thereof)

As the aluminum nitride as the starting material for the silicon-containing oxide coated aluminum nitride, a known product such as a commercially available product can be used. The aluminum nitride may be obtained by any production method. The aluminum nitride to be used may be, for example, aluminum nitride obtained by a "direct nitriding method", in which a metal aluminum powder is directly reacted with nitrogen or ammonia, or a "reduction nitriding method", in which alumina is subjected to carbonthermic reduction and also simultaneously heated in a nitrogen or ammonia atmosphere to cause the nitriding reaction.

The shape of the silicon-containing oxide coated aluminum nitride is not particularly limited, but examples thereof include amorphous (crushed), spherical, elliptical, and plate-like (flaky) shapes.

Due to having a silicon-containing oxide coating on the surface, the silicon-containing oxide coated aluminum nitride greatly contributes to improving the durability of the cured product of the thermally conductive resin composition. This is presumed to be due to the improved "moisture resistance" of the cured product of the thermally conductive resin composition. A commercially available product can also be used as the silicon-containing oxide coated aluminum nitride.

Since aluminum nitride itself has excellent thermal conductivity, aluminum nitride having a silicon-containing oxide coating on the surface thereof (hereinafter, also referred to as "silicon-containing oxide-coated aluminum nitride") also has excellent thermal conductivity.

Examples of the "silicon-containing oxide" that forms the silicon-containing oxide coating include silica, and oxides including silicon and aluminum.

The silicon-containing oxide coating may cover a part or all of the surface of the aluminum nitride. Hereinafter, the ratio of the aluminum nitride surface covered with the silicon-containing oxide coating is referred to as "coverage". The coverage can be determined by low energy ion scattering (LEIS) spectroscopy. LEIS spectroscopy is a measuring method in which an ion source and a rare gas are used as probes, and is analytical approach in which a rare gas at several keV is used as an incident ion, and LEIS spectroscopy is an evaluation method that enables composition analysis of an outermost surface (see: The TRC News 201610-04 (October 2016)).

In the silicon-containing oxide-coated aluminum nitride, the coverage determined by LEIS spectroscopy is not particularly limited, but is preferably 70% or more and 100% or less, more preferably 70% or more and 95% or less, further preferably 72% or more and 90% or less, and particularly preferably 74% or more and 85% or less. When the coverage is 70% or more and 100% or less, durability is much better. When the coverage is 95% or less, a high thermal conductivity can be maintained.

The coverage (%) with the silicon-containing oxide coating ($SiO_2$) on the surface of the aluminum nitride can be determined by the following expression, after LEIS spectroscopy:

$(S_{Al}(AlN) - S_{Al}(AlN+SiO_2))/S_{Al}(AlN) \times 100$ wherein, $S_{Al}(AlN)$ is the area of the Al peak of the aluminum nitride, and $S_{Al}(AlN+SiO_2)$ is the area of the Al peak of the silicon-containing oxide-coated aluminum nitride. The areas of the Al peaks can be determined by LEIS spectroscopy.

(Method of Forming Silicon-Containing Oxide Coating)

There is no particular restriction on the method of forming the silicon-containing oxide coating on the surface of the aluminum nitride. An example thereof is a method including the first step of coating the surface of the aluminum nitride with a siloxane compound including a structural unit represented by the following formula (1), and the second step of heating the aluminum nitride coated with the siloxane compound at a temperature of preferably 300° C. or higher and 800° C. or lower.

(1)

wherein, R is an alkyl group having 1 to 4 carbon atoms.

In formula (1), R is an alkyl group having 1 to 4 carbon atoms, that is, a methyl group, an ethyl group, a propyl group or a butyl group, preferably a methyl group, an ethyl group, an isopropyl group, or a t-butyl group, and more preferably a methyl group.

The siloxane compound is preferably an oligomer or polymer including a structural unit represented by formula (1). As used herein, the term "oligomer" refers to a compound having a weight average molecular weight of 2,000 or less, and the term "polymer" refers to a compound having a weight average molecular weight of more than 2,000. The siloxane compound may be linear, branched, or cyclic. The weight average molecular weight of the siloxane compound is preferably 100 to 2,000, more preferably 150 to 1,000, and further preferably 180 to 500, in view of ease of forming a silicon-containing oxide coating having a uniform thickness. As used herein, the weight average molecular weight is a value in terms of polystyrene determined by gel permeation chromatography (GPC).

As the siloxane compound, it is preferable to use at least one selected from the group consisting of a siloxane compound represented by the following formula (2) and a siloxane compound represented by the following formula (3):

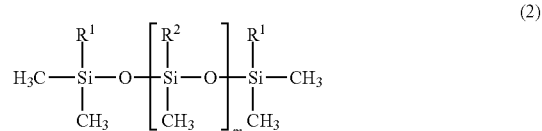

(2)

wherein $R^1$ and $R^2$ are each independently a hydrogen atom or a methyl group, and at least one of $R^1$ and $R^2$ is a hydrogen atom; and m is an integer of 0 to 10, preferably 1 to 5, and more preferably 1,

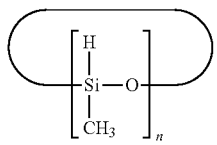

(3)

wherein n is an integer of 3 to 6, preferably 3 to 5, and more preferably 4.

As the siloxane compound, a cyclic hydrogen siloxane oligomer in which n is 4 in the formula (3) is particularly preferable, in view of ease of forming a good silicon-containing oxide coating.

In the first step, the surface of the aluminum nitride is coated with a siloxane compound including the structure represented by the formula (1).

In the first step, the method thereof is not particularly limited as long as the surface of the aluminum nitride can be coated with the siloxane compound including the structure represented by the formula (1). For example, the method of the first step may be a dry mixing method in which the siloxane compound is added by spraying or the like while stirring the aluminum nitride as the starting material using a general powder mixer to dry mix the components to thereby achieve the coating.

Examples of the powder mixer include a Henschel mixer (manufactured by Nippon Coke & Engineering Co., Ltd.), a container rotating type V blender, a container rotating type double cone blender, a ribbon blender having mixing blades, a screw blender, a closed rotary kiln, and stirring with a stirrer in a closed container using a magnetic coupling. The temperature conditions are not particularly limited, but are preferably 10° C. or higher and 200° C. or lower, more preferably 20° C. or higher and 150° C. or lower, and further preferably 40° C. or higher and 100° C. or lower.

A gas-phase adsorption method may also be used in which the vapor of the siloxane compound alone or a mixed gas of an inert gas such as nitrogen gas and the vapor of the siloxane compound is caused to adhere to or be deposited on the aluminum nitride surface at rest. The temperature conditions are not particularly limited, but are preferably 10° C. or higher and 200° C. or lower, more preferably 20° C. or higher and 150° C. or lower, and further preferably 40° C. or higher and 100° C. or lower. In the gas-phase adsorption method, the inside of the system may be pressurized or depressurized as necessary. As the apparatus that can be used in this case, an apparatus that is a closed system and can easily purge the gas in the system is preferable. For example, a glass container, a desiccator, a CVD (Chemical Vapor Deposition) apparatus, and the like can be used.

The amount of the siloxane compound used in the first step is not particularly limited. In the aluminum nitride coated with the siloxane compound obtained in the first step, the amount of the siloxane compound coating is preferably 0.1 mg or more and 1.0 mg or less, more preferably 0.2 mg or more and 0.8 mg or less, and further preferably 0.3 mg or more and 0.6 mg or less, per 1 $m^2$ of surface area calculated from the BET specific surface area ($m^2$/g) of the aluminum nitride. When the amount of the siloxane compound coating is within the above range, aluminum nitride having a silicon-containing oxide coating with a uniform thickness can be obtained.

The amount of the siloxane compound coating per 1 $m^2$ of surface area calculated from the BET specific surface area ($m^2$/g) of the aluminum nitride can be obtained by dividing the difference in the mass of the aluminum nitride before and after coating with the siloxane compound by the surface area ($m^2$) calculated from the BET specific surface area ($m^2$/g) of the aluminum nitride.

In the second step, the aluminum nitride coated with the siloxane compound obtained in the first step is heated at a temperature of preferably 300° C. or higher and 800° C. or lower, whereby a silicon-containing oxide coating can be formed on the aluminum nitride surface. The heating temperature is more preferably 400° C. or higher and 800° C. or lower, and further preferably 500° C. or higher and 800° C. or lower.

The heating time is preferably 30 minutes or more and 6 hours or less, more preferably 45 minutes or more and 4 hours or less, and further preferably 1 hour or more and 2 hours or less, in view of ensuring a sufficient reaction time and efficiently forming a good silicon-containing oxide coating.

The atmosphere during the heat treatment is preferably an atmosphere including oxygen gas, for example, an air atmosphere (the air).

The silicon-containing oxide-coated aluminum nitride grains after the heat treatment in the second step may be in a partially fused state. In such a case, for example, a silicon-containing oxide-coated aluminum nitride without sticking or agglomeration can be obtained by pulverizing using a general pulverizer, such as a roller mill, a hammer mill, a jet mill, a ball mill, or the like.

Further, after the second step is complete, the first step and the second step may again be performed in order. That is, the process of performing the first step and the second step in order may be repeatedly performed.

(2-2. Metal Oxide)

Examples of the metal oxide include zinc oxide, alumina, magnesium oxide, silicon dioxide, and iron oxide. Among these, alumina is preferable because it has high thermal conductivity, has a lineup of various particle sizes, and has a high degree of freedom in combination with the metal nitride. That is, the metal oxide preferably includes alumina.

As the alumina, α-alumina (α-$Al_2O_3$) is preferable. In addition to α-alumina, γ-alumina, θ-alumina, δ-alumina, and the like may be included. The shape of the alumina is not particularly limited, but examples thereof include amorphous (crushed), spherical, round, and polyhedral shapes.

(2-3. Properties of Thermally Conductive Powder)

The particle diameter of the thermally conductive powder at 50% cumulative volume (hereinafter referred to as D50) in a particle size distribution measured by laser diffraction scattering method is preferably 0.1 μm or more and 200 μm or less, more preferably 0.5 μm or more and 100 μm or less, and further preferably 1.0 μm or more and 50 μm or less, in view of the handling properties when adjusting the thickness of the heat conducting material and kneading the thermally conductive powder into the liquid resin. The D50 of the thermally conductive powder can be measured by a particle size distribution analyzer, and specifically is measured by the method described in the Examples.

In particular, the D50 of the alumina is not particularly limited, but is preferably 0.1 μm or more and 40 μm or less, more preferably 0.1 μm or more and lam or less, and further preferably 0.5 μm or more and 20 μm or less.

In particular, the D50 of the silicon-containing oxide coated aluminum nitride is not particularly limited, but is preferably 0.2 μm or more and 200 μm or less, more preferably 10 µm or more and 100 µm or less, further preferably more than 30 µm and 100 µm or less, particularly preferably 40 µm or more and 100 lam or less, most preferably 40 µm or more and 80 µm or less, and may be 40 µm or more and 60 µm or less.

In view of high filling of the thermally conductive powder, the specific surface area of the thermally conductive powder is preferably 0.01 m²/g or more and 10 m²/g or less, more preferably 0.02 m²/g or more and 9 m²/g or less, and further preferably 0.03 m²/g or more and 8 m²/g or less.

In particular, the specific surface area of alumina is not particularly limited, but is preferably 0.05 m²/g or more and 10 m²/g or less, more preferably m²/g or more and 9 m²/g or less, and further preferably 0.1 m²/g or more and 8 m²/g or less.

In particular, the specific surface area of the silicon-containing oxide coated aluminum nitride is not particularly limited, but is preferably 0.01 m²/g or more and 0.3 m²/g or less, more preferably 0.02 m²/g or more and 0.25 m²/g or less, further preferably 0.03 m²/g or more and 0.2 m²/g or less, and particularly preferably 0.05 m²/g or more and 0.15 m²/g or less.

Herein, the specific surface area is a specific surface area determined by the BET method (hereinafter, referred to as the BET specific surface area), and is measured by the nitrogen adsorption BET single-point method involving the gas flow method. As an analyzer for evaluation, "Macsorb (registered trademark) HM model-1210" (manufactured by Mountech Co., Ltd.) can be used.

In the resin compositions described in PTL1 and PTL2, a thermal conductivity as high as 14 W/m·K or more is not obtained. The reason for this is probably that the boron nitride particles used in PTL1 and PTL2 have a large surface area, which prevents filling the boron nitride particles to a level high enough to increase the thermal conductivity to 14 W/m·K or more. Therefore, in view of achieving a thermal conductivity of 14 W/m·K or more, the specific surface area of the thermally conductive powder used in the present embodiment is preferably within the above range.

Two or more types of the thermally conductive powder having different particle sizes (D50) may be used in combination. For example, when alumina having a small particle size (e.g., alumina having a D50 of 0.1 µm or more and 30 lam or less) is used in combination with a silicon-containing oxide coated aluminum nitride having a particle size larger than the alumina (e.g., a silicon-containing oxide coated aluminum nitride having a D50 of more than 30 µm and 100 µm or less), a larger amount of the thermally conductive powder can be filled in the thermally conductive resin composition, so that the thermal conductivity of the thermally conductive resin composition can be increased.

From the same point of view, two or more types of alumina having different D50 values may be used in combination, three to seven types of alumina having different D50 values may be used in combination, or three to five types of alumina having different D50 values may be used in combination. It is also preferable to use one or more types of silicon-containing oxide coated aluminum nitride in combination with two or more types of alumina having different D50 values.

When two or more types of alumina having different D50s are used in combination as the thermally conductive powder, it is preferable to include alumina having a D50 of 0.1 µm or more and 2 µm or less (hereinafter, referred to as "alumina I") and alumina having a D50 exceeding 2 µm and 30 µm or less (hereinafter, referred to as "alumina II"). In this case, the mass ratio between alumina I and alumina II, alumina I/alumina II, is not particularly limited, but is preferably 10/90 to 60/40, more preferably 20/80 to 50/50, and further preferably 30/70 to 45/55, in view of increasing the amount of the thermally conductive powder filled in the thermally conductive resin composition.

As the thermally conductive powder, it is preferable to include the above-mentioned alumina I, alumina having a D50 exceeding 2 µm and 10 µm or less (hereinafter, referred to as "alumina IIa"), and alumina having a D50 exceeding lam and 30 µm or less (hereinafter, referred to as "alumina IIb"). In this case, the mass ratio between alumina IIa and alumina IIb, alumina IIa/alumina IIb, is not particularly limited, but is preferably 40/60 to 90/10, more preferably 50/50 to further preferably 55/45 to 75/25, and particularly preferably 60/40 to in view of increasing the amount of the thermally conductive powder filled in the thermally conductive resin composition. It is noted that the mass ratio of the alumina I to the total amount of the alumina IIa and the alumina IIb (this corresponds to the amount of alumina II) is as described above for the alumina I/alumina II.

(2-4. Content)

In the thermally conductive resin composition of the present embodiment, the content of the silicon-containing oxide coated aluminum nitride is 10% by mass or more and 70% by mass or less, preferably 20% by mass or more and 60% by mass or less, more preferably 30% by mass or more and 60% by mass or less, and further preferably 40% by mass or more and 50% by mass or less, based on the total amount of the thermally conductive resin composition. When the content of the silicon-containing oxide coated aluminum nitride is 10% by mass or more based on the total amount of the thermally conductive resin composition, high thermal conductivity and excellent durability can be exhibited. When the content of the silicon-containing oxide coated aluminum nitride is 70% by mass or less based on the total amount of the thermally conductive resin composition, the silicon-containing oxide coated aluminum nitride can be sufficiently filled in the epoxy resin.

In the thermally conductive resin composition of the present embodiment, the content of the other thermally conductive powder corresponds to the total amount of the thermally conductive powder minus the content of the silicon-containing oxide coated aluminum nitride. Specifically, the content of the other thermally conductive powder is 10% by mass or more and 89% by mass or less, preferably 20% by mass or more and 79% by mass or less, more preferably 20% by mass or more and 69% by mass or less, and further preferably 30% by mass or more and 59% by mass or less, based on the total amount of the thermally conductive resin composition. When the content of the other thermally conductive powder is 10% by mass or more based on the total amount of the thermally conductive resin composition, the ease of filling the thermally conductive powder into the epoxy resin are excellent, and when the content of the other thermally conductive powder is 89% by mass or less, a high thermal conductivity and excellent durability can be exhibited.

In the thermally conductive powder, the mass ratio of the silicon-containing oxide coated aluminum nitride to the other thermally conductive powder [silicon-containing oxide coated aluminum nitride/other thermally conductive powder] is not particularly limited, but in view of enhancing the ease of filling the thermally conductive powder into the epoxy resin, the mass ratio is preferably 20/80 to 80/20, more preferably 30/70 to 70/30, further preferably to 60/40, and particularly preferably is 45/55 to 55/45. When the other thermally conductive powder includes a metal oxide, the mass ratio of the silicon-containing oxide coated aluminum nitride to the metal oxide [silicon-containing oxide coated aluminum nitride/metal oxide] is preferably 20/80 to 80/20, more preferably 30/70 to 70/30, further preferably 40/60 to 60/40, and particularly preferably 45/55 to 55/45, in view of enhancing the ease of filling the thermally conductive powder into the epoxy resin. Further, also in the case where the metal oxide includes alumina, the mass ratio of the silicon-containing oxide coated aluminum nitride to the alumina [silicon-containing oxide coated aluminum nitride/alumina] is preferably 20/80 to 80/20, more preferably 30/70 to 70/30, further preferably 40/60 to 60/40, and particularly preferably 45/55 to 55/45, in view of enhancing the ease of filling the thermally conductive powder into the epoxy resin.

In the thermally conductive powder, the total content of the silicon-containing oxide coated aluminum nitride and the metal oxide is preferably 90% by mass or more, more preferably 95% by mass or more, and particularly preferably 100% by mass, based on the total amount of the thermally conductive powder, in view of increasing the thermal conductivity. The same can be said also in the case where the metal oxide includes alumina.

The content of the thermally conductive powder (that is, the total content of silicon-containing oxide coated aluminum nitride and the other thermally conductive powder) is 80% by mass or more and 99% by mass or less, preferably 85% by mass or more and 98% by mass or less, more preferably 90% by mass or more and 97% by mass or less, further preferably 92% by mass or more and 97% by mass or less, and most preferably 94% by mass or more and 97% by mass or less, based on the total amount of the thermally conductive resin composition of the present embodiment. When the content of the thermally conductive powder is 80% by mass or more, the thermal conductivity can be increased, and when the content is 99% by mass or less, the thermally conductive powder can be kneaded with a liquid resin.

[3. Curing Agent]

The thermally conductive resin composition of the present embodiment may optionally contain a curing agent. The curing agent is not particularly limited, and a known curing agent for epoxy resins may be used. Examples of the curing agent include phenol-based curing agents, amine-based curing agents, acid anhydride-based curing agents, isocyanate-based curing agents, polyaminoamide-based curing agents, and thiol-based curing agents. One type of the curing agent may be used alone, or two or more types may be used in combination.

In one preferred embodiment, a phenol-based curing agent, and particularly, a resorcinol novolac resin, among these, may be used as the curing agent. The hydroxyl group equivalent of the phenol-based curing agent is not particularly limited, but is preferably 20 to 200 g/eq, more preferably 30 to 150 g/eq, further preferably 40 to 100 g/eq, and particularly preferably 45 to 80 g/eq.

When the thermally conductive resin composition of the present embodiment contains a curing agent, the content of the curing agent is not particularly limited, but is preferably 5 parts by mass or more and 40 parts by mass or less, more preferably 10 parts by mass or more and 35 parts by mass or less, and further preferably 15 parts by mass or more and 35 parts by mass or less, based on 100 parts by mass of the epoxy resin.

The thermally conductive resin composition of the present embodiment may also contain a curing accelerator, a dispersant, a solvent, a discoloration inhibitor, a flexibility imparting agent, an inorganic ion scavenger, a colorant, a viscosity modifier, a reaction accelerator, and the like.

[4. Curing Accelerator]

Examples of the curing accelerator include imidazole compounds and their derivatives, organic phosphorus compounds, secondary amines, tertiary amines, and quaternary ammonium salts. One type of the curing accelerator may be used alone, or two or more types may be used in combination. Among these, an organic phosphorus compound is preferred in view of suppressing homopolymerization of the epoxy resin to facilitate the reaction between the epoxy resin and the curing agent.

When the thermally conductive resin composition of the present embodiment contains a curing accelerator, the content of the curing accelerator is not particularly limited, but is preferably 0.1 parts by mass or more and 10 parts by mass or less, more preferably 0.3 parts by mass or more and 5 parts by mass or less, and further preferably 0.5 or more and 3 parts by mass or less, based on 100 parts by mass of the epoxy resin.

[5. Dispersant]

When the thermally conductive resin composition of the present embodiment contains a dispersant, the thermally conductive powder can be favorably dispersed in the thermally conductive resin composition to improve the performance of the thermally conductive resin composition and a cured product thereof.

Examples of the dispersant include, but are not limited to, elastomers, coupling agents, and wetting and dispersing agents. One type of the dispersant may be used alone, or two or more types may be used in combination. The elastomer, the coupling agent, and the wetting and dispersing agent can be used in combination. The elastomer, coupling agent and wetting and dispersing agent will be described in order below.

(5-1. Elastomer)

When the thermally conductive resin composition of the present embodiment contains an elastomer, the elastomer functions for reducing the viscosity of the thermally conductive resin composition, and accordingly, the increase in viscosity caused by containing the thermally conductive powder can be reduced to favorably disperse the thermally conductive powder. As a result, the performance of the thermally conductive resin composition and a cured product thereof can be improved, and the effect of reducing the occurrence of voids can also be obtained. In addition, the elastomer contained imparts flexibility to a coating film formed by applying a film with the thermally conductive resin composition containing a solvent.

The weight average molecular weight of the elastomer is not particularly limited, but in view of compatibility with the curable resin, it is preferably 10,000 or more and 100,000 or less, and more preferably 10,000 or more and 50,000 or less. Considering the dispersibility and ease of kneading of the thermally conductive powder, the weight average molecular weight is further preferably 10,000 or more and 30,000 or less.

The elastomer preferably has at least one polarizable functional group. Here, the polarizable functional group (hereinafter, also referred to as a "polarizable group") means a functional group that includes two or more types of atoms with different electronegativities and that has a dipole moment. Examples of the polarizable group include a carboxy group, an ester group, a hydroxy group, a carbonyl group, an amide group, and an imide group. Among these, the polarizable group is preferably at least one selected from the group consisting of a carboxy group, an ester group, and a hydroxy group, in view of adsorption to the thermally conductive powder.

In the case where the elastomer has a polarizable functional group, the polarizable functional group can form a hydrogen bond or electrostatically interact with an oxygen atom, for example, on the surface of the thermally conductive powder (e.g., alumina). Therefore, the elastomer containing a polarizable functional group can efficiently adhere to the surface of the thermally conductive powder to efficiently coat at least a portion of the surface of the thermally conductive powder (e.g., alumina) with the elastomer. In addition, the elastomer present on at least part of the surface of the thermally conductive powder smooths the surface of the thermally conductive powder, thereby reducing the viscosity of the thermally conductive resin composition. Moreover, the flexibility of a cured product formed by using the thermally conductive resin composition is improved. In addition, it is believed that the improved flexibility contributes to stress relaxation to improve the adhesion between the cured product and the metal substrate.

The content of the polarizable group included in the elastomer is not particularly limited. The content of the structural unit having a polarizable group in the elastomer resin is preferably 30 mol % or more, and more preferably 50 mol % or more. When the content of the polarizable group is within this range, the dispersibility of the thermally conductive powder is further improved.

There is no particular limitation on the type of the elastomer. Examples include a silicone elastomer, a nitrile elastomer, and an acrylic elastomer. Among these elastomers, an acrylic elastomer is preferable in view of adhesion to the surface of the thermally conductive powder.

When the thermally conductive resin composition of the present embodiment contains an elastomer, the content of the elastomer is preferably 0.1% by mass or more and 5% by mass or less, more preferably 0.2% by mass or more and 2% by mass or less, and further preferably 0.2% by mass or more and 1.5% by mass or less, based on the total amount of the thermally conductive resin composition of the present embodiment. When the content of the elastomer is 0.1% by mass or more, the dispersion of the thermally conductive powder in the thermally conductive resin composition can be enhanced, and when the content of the elastomer is 5% by mass or less, the elastomer does not interfere with the thermal conductivity of the thermally conductive resin composition or cured product thereof.

(5-2. Coupling Agent)

When the thermally conductive resin composition of the present embodiment contains a coupling agent, the dispersion of the thermally conductive powder can be improved and, as a result, the performance of the thermally conductive resin composition and a cured product thereof can be improved. Examples of the coupling agent include silane-based coupling agents, titanate-based coupling agents, and silicone oligomers.

When the thermally conductive resin composition of the present embodiment contains a coupling agent, the content of the coupling agent is preferably 0.1% by mass or more and 5% by mass or less, more preferably 0.2% by mass or more and 2% by mass or less, and further preferably 0.2% by mass or more and 1.5% by mass or less, based on the total amount of the thermally conductive resin composition of the present embodiment. When the content of the coupling agent is 0.1% by mass or more, the dispersion of the thermally conductive powder in the thermally conductive resin composition can be enhanced, and when the content of the coupling agent is 5% by mass or less, the coupling agent does not interfere with the thermal conductivity of the thermally conductive resin composition or cured product thereof.

(5-3. Wetting and Dispersing Agent)

When the thermally conductive resin composition of the present embodiment contains a wetting and dispersing agent, the dispersion of the thermally conductive powder can be improved and, as a result, the performance of the thermally conductive resin composition and a cured product thereof can be improved.

Examples of the wetting and dispersing agent include fluorine-based wetting and dispersing agents and silicone-based wetting and dispersing agents. One type of the wetting and dispersing agent may be used alone, or two or more types may be used in combination. A commercially available product can be used for the wetting and dispersing agent.

When the thermally conductive resin composition of the present embodiment contains a wetting and dispersing agent, the content of the wetting and dispersing agent is preferably 0.01% by mass or more and 3% by mass or less, more preferably 0.05% by mass or more and 2% by mass or less, and further preferably 0.05% by mass or more and 1% by mass or less, based on the total amount of the thermally conductive resin composition of the present embodiment. When the content of the wetting and dispersing agent is 0.01% by mass or more, the dispersion of the thermally conductive powder in the thermally conductive resin composition can be enhanced, and when the content of the wetting and dispersing agent is 3% by mass or less, the wetting and dispersing agent does not interfere with the thermal conductivity of the thermally conductive resin composition or cured product thereof.

In view of improving the performance of the thermally conductive resin composition and a cured product thereof, the content (total content) of the dispersant in the thermally conductive resin composition of the present embodiment is preferably 0.1% by mass or more and 5% by mass or less, more preferably 0.2% by mass or more and 3% by mass or less, and further preferably 0.5% by mass or more and 2% by mass or less, based on the total amount of the thermally conductive resin composition of the present embodiment.

[6. Solvent]

The thermally conductive resin composition of the present embodiment may contain a solvent. The solvent may be used as a diluent, or may be used to dissolve a predetermined component. An examples of using to dissolve a predetermined component is a case in which a semi-solid component or a solid component such as an epoxy resin monomer, the curing agent, or the curing accelerator is dissolved in at least one solvent before mixing in the production of the thermally conductive resin composition of the present embodiment.

The solvent is not particularly limited as long as it does not inhibit the curing of the thermally conductive resin composition, and can be appropriately selected from among commonly used solvents. Examples of the solvent include a ketone organic solvent such as methyl ethyl ketone and cyclohexanone, and an aromatic hydrocarbon organic solvent such as toluene and xylene. One type of the solvent may be used alone, or two or more types may be used in combination.

In the thermally conductive resin composition of the present embodiment, the content of the solvent is not particularly limited, and can be appropriately selected according to the level of the ease of applying the thermally conductive resin composition.

In addition, known agents can be used for the discoloration inhibitor, the flexibility imparting agent, the inorganic ion scavenger, the colorant, the viscosity modifier, and the reaction accelerator.

(Method for Preparing Thermally Conductive Resin Composition)

The thermally conductive resin composition of the present embodiment can be obtained by feeding, all at once or separately, the epoxy resin, the thermally conductive powder, and the other optional components to a dispersing/dissolving apparatus, and then mixing, dissolving, and kneading while heating as necessary. Examples of the dispersing/dissolving apparatus include a mortar machine, a planetary mixer, a rotation/revolution mixer, a kneader, and a roll mill.

<Cured Product>

By heating the thermally conductive resin composition of the present embodiment to cure it, a cured product of the thermally conductive resin composition can be obtained. In particular, a cured sheet of the thermally conductive resin composition can be obtained by applying the thermally conductive resin composition of the present embodiment onto a film, drying to remove the solvent, and then curing by heating. The cured sheet is one type of the cured product described above. Although the heating temperature is not particularly limited, the heating temperature is preferably 150° C. or higher and 200° C. or lower, more preferably 155° C. or higher and 200° C. or lower, and further preferably 160° C. or higher and 180° C. or lower, in view of sufficient curing. The operation of curing by heating may be carried out in two or more stages. In this case, it is preferable to drive the curing reaction by heating at the highest temperature in the final stage.

The thickness of the cured sheet is not particularly limited, and may be 100 lam or more and 400 µm or less, may be 150 µm or more and 400 µm or less, may be 150 µm or more and 300 µm or less, or may be 150 µm or more and 250 µm or less.

The cured product may be in a B-stage state, that is, in a semi-cured state, but is preferably in a C-stage state, which is a further cured state. The B-stage and the C-stage are as defined in JIS K6900 (1994).

(Heat Conductivity and Durability of Cured Product)

The cured product of the thermally conductive resin composition of the present embodiment has extremely high thermal conductivity, and can have a thermal conductivity of 14 W/m·K or more. The thermal conductivity of the cured product of the thermally conductive resin composition of the present embodiment is preferably 15 to 20 W/m·K, and may be may be 15 to 18 W/m·K, may be 15 to 17 W/m·K, or may be 15 to 16 W/m·K. The thermal conductivity can be measured by a flash method in accordance with ISO 18755, and specifically, the thermal conductivity is a value measured by the method described in the Examples.

The cured product of the thermally conductive resin composition of the present embodiment has a rate of reduction in the thermal conductivity of less than 10%, after 168 hours in a pressure cooker test at 120° C., 2 atm (0.2 MPa), and 100% relative humidity [100×(thermal conductivity before test−thermal conductivity after 168 hours)/(thermal conductivity before test)], and thus, the cured product has excellent durability. The rate of reduction is preferably 8% or less, more preferably 5% or less, further preferably 3% or less, and particularly preferably 2% or less.

Since the cured product of the thermally conductive resin composition of the present embodiment has excellent thermal conductivity and durability, the thermally conductive resin composition of the present embodiment and a cured product thereof can be suitably used for exothermic electronic parts of an electronic device, a personal computer, an automobile ECU (electronic control unit), a battery, and the like. More specifically, the thermally conductive resin composition of the present embodiment is useful as a thermally conductive member, such as heat dissipating grease, a sheet, and an adhesive, provided between a heat generating source and a heat dissipating member of an electronic device.

In particular, considering its excellent durability, the cured product of the thermally conductive resin composition of the present embodiment is also useful as a heat dissipation material for power modules that generally generate a large amount of heat.

<Heat Conducting Member and Electronic Device>

A heat conducting member including a cured product of the thermally conductive resin composition of the present embodiment is also one embodiment.

By arranging a heat dissipating member on an exothermic electronic part via the heat conducting member of the present embodiment, heat generated from the electronic part is efficiently released to the outside via the heat conducting member and the heat dissipating member. Examples of the heat dissipating member include, but are not limited to, (i) a fin made of aluminum or copper, (ii) a block made of aluminum or copper connected to a heat sink or a heat pipe, (iii) a block made of aluminum or copper that internally circulates a cooling liquid by a pipe, (iv) a Peltier element, and (v) a block made of aluminum or copper that has a Peltier element.

The heat conducting member of the present embodiment has high thermal conductivity and excellent heat resistance, and is thus useful for power module heat dissipation applications.

Further, an electronic device having the above-described heat conducting member and a heat dissipating member is also one embodiment. Usually, the heat dissipating member is arranged on the electronic device via the heat conducting member.

EXAMPLES

Next, the present invention will be specifically described by way of examples, but the present invention is not limited by these examples.

Example 1 and Comparative Examples 1 and 2

(Preparation of Thermally Conductive Resin Composition)

Components were weighed into a polyethylene container in the amounts blended, based on 100 parts by mass of the total content of the epoxy resin, as shown in Table 1, placed into a rotation/revolution mixer (manufactured by Thinky Corporation), and subjected to stirring and mixing three times at a rotational speed of 2,000 rpm for 20 seconds to obtain the thermally conductive resin composition of each of the examples and comparative examples. The amounts blended shown in Table 1 are amounts on the premise that all of the solvent had been removed. Blank entries in Table 1 indicate that the component was not added.

(Production of Cured Sheet)

The thermally conductive resin compositions obtained above were applied on a release PET film (manufactured by Panac Co., Ltd., thickness 75 µm) to a thickness of 300 µm using a film coater (PI-1210, manufactured by Tester Sangyo Co., Ltd.). Then, the solvent was removed by drying for 10 minutes at room temperature and for 20 minutes in an oven at 100° C. After drying, the thermally conductive resin composition was sandwiched by placing another release PET film that was the same type as the one described above on the surfaces of the thermally conductive resin composition, and then heat-pressed at 150° C. and 10 MPa for 3 minutes using a heat press machine (H300-15, manufactured by AS ONE Co., Ltd.) to obtain a B-stage (semi-cured) thermally conductive resin composition sheet. Next, the release PET films present on both sides were peeled off, then copper foil (manufactured by Takumi Giken YK, thickness 15 μm) was disposed on each side of the B-stage (semi-cured) thermally conductive resin composition sheet to sandwiched it. The resultant was heat-pressed at 165° C. and 10 MPa for 1 hour using the above-described heat press machine, and the copper foil was peeled off to obtain a cured sheet (thickness 200 μm) of the thermally conductive resin composition in a C-stage state.

Various evaluations were performed on the obtained cured sheet according to the evaluation methods described later. The results are shown in Table 1.

The details of each component listed in Table 1 are as follows.

<Epoxy Resin>
  EPPN-502H: Manufactured by Nippon Kayaku Co., Ltd., triphenylmethane type epoxy resin, epoxy equivalent: 158 to 178 g/eq. It was used in the form of a solution having an active concentration of 50% by mass in cyclohexanone.
  ZX-1059: Manufactured by Nippon Steel Chemical & Material Co., Ltd., mixture of bisphenol F diglycidyl ether resin and bisphenol A diglycidyl ether resin, epoxy equivalent: 165 g/eq.

<Curing Agent>
  Resorcinol novolac: Manufactured by Showa Denko Materials Co., Ltd., hydroxyl equivalent: 62 g/eq. It was used in the form of a solution having an active concentration of 33% by mass in cyclohexanone.

<Curing Accelerator>
  Triphenylphosphine: Manufactured by Kanto Chemical Co., Ltd. It was used in the form of a solution having an active concentration of 16.7% by mass in cyclohexanone.

<Dispersants>
  Elastomer: Acrylic elastomer, manufactured by Showa Denko Materials Co., Ltd., weight average molecular weight: 24,000
  Coupling agent: Silane coupling agent "KBM-573", N-phenyl-3-aminopropyltrimethoxysilane, manufactured by Shin-Etsu Chemical Co., Ltd.
  Wetting and dispersing agent: BYK-106, a salt of a polymer having an acid group, manufactured by BYK-Chemie Japan KK.

<Thermally Conductive Powder>
(Silicon-Containing Oxide-Coated Aluminum Nitride)
  AlN5001: Manufactured by Showa Denko K.K., D50=45 μm, BET specific surface area=0.09 $m^2$/g, coverage determined by LEIS spectroscopy 75% (Aluminum nitride) FAN-f50-A1: Manufactured by Furukawa Denshi Co., Ltd., D50=42 μm, BET specific surface area=0.08 $m^2$/g, no silicon-containing oxide coating on the surface.

(Metal Oxide)
  Alumina 1: Alnuabeads (registered trademark) CB-A50S, manufactured by Showa Denko K.K., D50=50 μm, BET specific surface area=0.10 $m^2$/g
  Alumina 2: Sumicorundum (registered trademark) AA-18, manufactured by Sumitomo Chemical Co., Ltd., D50=20 μm, BET specific surface area=0.15 $m^2$/g
  Alumina 3: Sumicorundum (registered trademark) AA-5, manufactured by Sumitomo Chemical Co., Ltd., D50=6 μm, BET specific surface area=0.28 $m^2$/g
  Alumina 4: Sumicorundum (registered trademark) AA-3, manufactured by Sumitomo Chemical Co., Ltd., D50=3.7 μm, BET specific surface area=0.48 $m^2$/g
  Alumina 5: Sumicorundum (registered trademark) AA-04, manufactured by Sumitomo Chemical Co., Ltd., D50=0.5 μm, BET specific surface area=4.10 $m^2$/g <Methods for Measuring Various Physical Properties of the Components>

The epoxy equivalent of the epoxy resin was measured by a perchloric acid titration method in accordance with JIS K 7236 (2009).

The hydroxyl group equivalent of the curing agent was measured by an acetyl chloride-potassium hydroxide titration method. Specifically, the hydroxyl groups of the curing agent to be measured were acetylated with acetyl chloride in a pyridine solution, then the excess acetyl chloride was decomposed with water, and the produced acetic acid was titrated with a potassium hydroxide/methanol solution. The end point of titration was determined by potentiometric titration.

The weight average molecular weight of the elastomer is a value in terms of polystyrene determined by gel permeation chromatography (GPC). As the measurement apparatus, "Shodex (registered trademark) GPC System-21 (columns: KF-802, KF-803, KF-805)", manufactured by Showa Denko K.K. was used. The measurement conditions were as follows: column temperature 40° C., tetrahydrofuran as an eluent, and elution rate 1 ml/min.

The D50 of the thermally conductive powder was the particle size at which the cumulative volume reached 50% in a particle size distribution measured using a laser diffraction particle size distribution analyzer (manufactured by MicrotracBEL Co., Ltd., trade name: MT3300EXII).

The specific surface area of the thermally conductive powder was obtained as the BET specific surface area measured by the nitrogen adsorption BET single-point method involving the gas flow method. As the analyzer for evaluation, "Macsorb (registered trademark) HM model-1210" (manufactured by Mountech Co., Ltd.) was used.

[Evaluation Methods]
(I) Thermal Conductivity

A sample of the cured sheet obtained in each example was prepared by the method described below, and the thermal diffusivity of the sample was measured at 25° C. using a thermal diffusivity measurement system by laser flash method "LFA447 NanoFlash" (manufactured by NETZSCH) in accordance with ISO 18755. Further, the theoretical specific heat of the cured sheet was determined by weighted average taking into account the amount of each component blended, on the assumption that each component simply has additivity. In addition, the density of a sample of cut into a 10 mm×10 mm size from the cured sheet was measured by the Archimedes method. A value obtained by multiplying the thermal diffusivity by the theoretical specific heat and the density was taken as the thermal conductivity of the cured sheet.

The above samples for thermal diffusivity measurement were obtained by cutting the cured sheet obtained in each example into a size of 10 mm×10 mm, applying a gold coating on both sides using an ion coater (IB-3: manufactured by Eikoh Co., Ltd.), and then further coating both sides with graphite.

The theoretical specific heat of the cured sheet in each example was calculated on the premise that the theoretical specific heat of the aluminum nitride was 0.73 J/g·K for, that of the alumina was 0.83 J/g·K, and that of the epoxy resin component including the curing agent was 1.80 J/g·K. The other components were trace amounts, and hence ignored.

(II) Rate of Reduction in Thermal Conductivity (Durability)

The cured sheet obtained in each example was cut into a size of 10 mm×10 mm, and then placed in a pressure vessel. Further, 5.0 g of deionized water was placed therein and the pressure vessel was sealed. Then, a pressure cooker test (hereinafter, referred to as "PCT") was performed by heating the pressure vessel in an oven (120° C., 2 atm (0.2 MPa), relative humidity 100%), and the thermal conductivity was measured according to the measurement method described above in (I) Thermal conductivity.

The thermal conductivity was measured a total of three times, namely, before the PCT, after 48 hours in the PCT, and after 168 hours in PCT, and the rate of reduction (%) in the thermal conductivity was calculated using the expression below. The resulting value was used as an index for durability. The smaller the rate of reduction in thermal conductivity, the better the durability.

Rate of reduction in thermal conductivity (%)=100×
(thermal conductivity before PCT−thermal conductivity after PCT)/(thermal conductivity before PCT)

On the other hand, in Comparative Example 1, in which aluminum nitride without a silicon-containing oxide coating on the surface was used instead of silicon-containing oxide-coated aluminum nitride, the thermal conductivity before the PCT was high, but the rate of reduction in thermal conductivity after the PCT was well over 10%, indicating that the durability was poor. Moreover, in Comparative Example 2, in which alumina 1 (D50=50 μm) was used instead of silicon-containing oxide-coated aluminum nitride, the thermal conductivity before the PCT was less than 14 W/m·K, which was insufficient, and the rate of reduction in thermal conductivity after the PCT was well over 10%, indicating poor durability.

The invention claimed is:

1. A cured product of a thermally conductive resin composition comprising an epoxy resin and a thermally conductive powder, wherein
the thermally conductive powder comprises aluminum nitride having a silicon-containing oxide coating on a surface thereof and another thermally conductive powder,
a content of the epoxy resin is 1% by mass or more and 20% by mass or less based on the total amount of the thermally conductive resin composition,
a content of the thermally conductive powder is 80% by mass or more and 99% by mass or less based on the total amount of the thermally conductive resin composition, a content of the aluminum nitride having a silicon-containing oxide coating on a surface thereof is

TABLE 1

| | | Component | | Example 1 | Comparative Example 1 | Comparative Example 2 |
|---|---|---|---|---|---|---|
| Thermally conductive resin composition | Epoxy resin | | EPPN-502H | 50 (1.58) | 50 (1.58) | 50 (1.58) |
| | | | ZX-1059 | 50 (1.58) | 50 (1.58) | 50 (1.58) |
| | Curing agent | Resorcinol novolac | — | 24 | 24 | 24 |
| | Curing accelerator | Triphenylphosphine | — | 1 | 1 | 1 |
| | Dispersants | Elastomer | — | 16 (0.50) | 16 (0.50) | 16 (0.50) |
| | | Coupling agent | KBM-573 | 13 (0.40) | 13 (0.40) | 13 (0.40) |
| | | Wetting and dispersing agent | BYK-106 | 5 (0.15) | 5 (0.15) | 5 (0.15) |
| | Thermally conductive powder | Silicon-containing oxide-coated aluminum nitride | AlN5001 (D50: 45 μm) | 1500 (47.4) | | |
| | | Aluminum nitride | FAN-f50-A1 (D50: 42 μm) | | 1500 (47.4) | |
| | | Metal oxide | Alumina 1 (D50: 50 μm) | | | 1500 (47.4) |
| | | | Alumina 2 (D50: 20 μm)_Alumina IIb | 300 (9.4) | 300 (9.4) | 300 (9.4) |
| | | | Alumina 3 (D50: 6 μm)_Alumina IIa | 300 (9.4) | 300 (9.4) | 300 (9.4) |
| | | | Alumina 4 (D50: 3.7 μm)_Alumina IIa | 300 (9.4) | 300 (9.4) | 300 (9.4) |
| | | | Alumina 5 (D50: 0.5 μm)_Alumina I | 600 (18.9) | 600 (18.9) | 600 (18.9) |
| Evaluations | (I) Thermal conductivity (W/m · K) | | Before PCT | 15.7 | 15.5 | 11.4 |
| | | | After 48 hours in PCT | 15.5 | 11.1 | 8.4 |
| | | | After 168 hours in PCT | 15.8 | 6.4 | 7.5 |
| | (II) Rate of reduction (%) in thermal conductivity | | After 48 hours in PCT | 1.3 | 28.4 | 26.3 |
| | | | After 168 hours in PCT | −0.6 | 58.7 | 34.2 |

*The unit of the amount of the component blended is parts by mass. The numerical value in parentheses is the content (mass %) based on the total amount of the thermally conductive resin composition.

From Table 1, it can be seen that the cured product obtained in Example 1 had a very high thermal conductivity of 14 W/m·K or more, and excellent durability with a rate of reduction in the thermal conductivity of less than 10% after 168 hours in the PCT. In Example 1, the thermal conductivity after 168 hours in the PCT was slightly higher than the thermal conductivity after 48 hours in the PCT; however, this was due to the influence of measurement error, and the thermal conductivity can be regarded as substantially unchanged between that after 48 hours in the PCT and that after 168 hours in the PCT.

10% by mass or more and 70% by mass or less based on the total amount of the thermally conductive resin composition, and a content of the other thermally conductive powder is 10% by mass or more and 89% by mass or less based on the total amount of the thermally conductive resin composition,
wherein the cured product has a thermal conductivity of 14 W/m·K or more, and has a rate of reduction in the thermal conductivity of less than 10% after 168 hours in a pressure cooker test at 120° C., 2 atm (0.2 MPa), and 100% relative humidity.

2. The cured product according to claim 1, wherein the aluminum nitride having a silicon-containing oxide coating on a surface thereof has a coverage of 70% or more and 100% or less as determined by low energy ion scattering spectroscopy.

3. The cured product according to claim 1, wherein the epoxy resin comprises at least one selected from the group consisting of a triphenylmethane-type epoxy resin and a bisphenol-type epoxy resin.

4. The cured product according to claim 1, wherein the other thermally conductive powder comprises a metal oxide.

5. The cured product of claim 4, wherein the metal oxide comprises alumina.

6. The cured product according to claim 1, which is for heat dissipation of a power module.

7. A heat conducting member comprising the cured product according to claim 1.

8. The heat conducting member according to claim 7, wherein the heat conducting member is for heat dissipation of a power module.

9. An electronic device comprising the heat conducting member according to claim 7 and a heat dissipating member.

* * * * *